(12) United States Patent
Jung et al.

(10) Patent No.: US 9,390,779 B2
(45) Date of Patent: Jul. 12, 2016

(54) SYSTEM AND METHOD OF SENSING A MEMORY CELL

(71) Applicants: QUALCOMM Incorporated, San Diego, CA (US); Industry-Academic Cooperation Foundation, Yonsei University, Seoul (KR)

(72) Inventors: Seong-Ook Jung, Gyeongggi-Do (KR); Taehui Na, Seoul (KR); Jisu Kim, Seoul (KR); Seung H. Kang, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 517 days.

(21) Appl. No.: 13/835,251

(22) Filed: Mar. 15, 2013

(65) Prior Publication Data

US 2014/0269031 A1  Sep. 18, 2014

(51) Int. Cl.
| | |
|---|---|
| G06F 11/22 | (2006.01) |
| G06F 17/50 | (2006.01) |
| G11C 11/16 | (2006.01) |
| G11C 13/00 | (2006.01) |
| G11C 27/02 | (2006.01) |

(52) U.S. Cl.
CPC ........ *G11C 11/1673* (2013.01); *G11C 11/1693* (2013.01); *G11C 13/004* (2013.01); *G11C 27/024* (2013.01); *G11C 2013/0054* (2013.01); *G11C 2013/0057* (2013.01)

(58) Field of Classification Search
USPC .......................................................... 716/136
See application file for complete search history.

(56) References Cited

U.S. PATENT DOCUMENTS

| | | | |
|---|---|---|---|
| 6,317,376 B1 | 11/2001 | Tran et al. | |
| 7,596,045 B2 | 9/2009 | DeBrosse et al. | |
| 7,706,201 B2 * | 4/2010 | Liaw et al. | 365/210.1 |
| 7,881,094 B2 | 2/2011 | Chen et al. | |
| 8,335,101 B2 | 12/2012 | Jung et al. | |
| 2003/0218901 A1 | 11/2003 | Ooishi et al. | |
| 2004/0004856 A1 | 1/2004 | Sakimura et al. | |
| 2009/0021976 A1 | 1/2009 | Liaw et al. | |
| 2011/0317497 A1 | 12/2011 | Yoon et al. | |
| 2012/0044755 A1 * | 2/2012 | Kim et al. | 365/171 |
| 2013/0051114 A1 | 2/2013 | Kim et al. | |

FOREIGN PATENT DOCUMENTS

EP   1329894 A1   7/2003

OTHER PUBLICATIONS

Driskill-Smith, et al., "Non-volatile Spin-Transfer Torque RAM (STT-RAM): An analysis of chip data, thermal stability and scalability," 2010 IEEE International Memory Workshop (IMW), 2010, pp. 1-3.

(Continued)

*Primary Examiner* — Eric Lee
(74) *Attorney, Agent, or Firm* — Toler Law Group

(57) ABSTRACT

A method includes sensing a state of a data cell to generate a data voltage. The state of the data cell corresponds to a state of a programmable resistance based memory element of the data cell. The method further includes sensing a state of a reference cell to generate a reference voltage. The state of the data cell and the state of the reference cell are sensed via a common sensing path. The method further includes determining a logic value of the data cell based on the data voltage and the reference voltage.

38 Claims, 5 Drawing Sheets

(56) References Cited

OTHER PUBLICATIONS

Takayuki, et al., "2 Mb SPRAM (Spin-Transfer Torque RAM) With Bit-by-Bit Bi-Directional Current Write and Parallelizing-Direction Current Read", IEEE Journal of Solid-State Circuits, vol. 43, No. 1, Jan. 2008; pp. 109-120.
International Search Report and Written Opinion for International Application No. PCT/US2014/024245, ISA/EPO, Date of Mailing Sep. 19, 2014, 19 pages.
Ono, K. et al, "A disturbance-free read scheme and a compact stochastic-spin-dynamics-based MTJ circuit model for Gb-scale SPRAM", 2009 IEEE International Electron Devices Meeting (IEDM), Dec. 7-9, 2009, pp. 1-4, Baltimore, MD.
Kim, Jung Pill et al, "A 45nm 1Mb Embedded STT-MRAM with design techniques to minimize read-disturbance", 2011 Symposium on VLSI Circuits Digest of Technical Papers, Jun. 15-17, 2011, pp. 296-297, Honolulu, HI.

\* cited by examiner

SYSTEM AND METHOD OF SENSING A MEMORY CELL

I. FIELD

The present disclosure is generally related to sensing a memory cell.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The circuitry within wireless telephones and other electronic devices may use a spin-transfer torque magnetoresistive random-access memory (STT-MRAM) for memory storage. Each memory cell within the STT-MRAM may be programmed by a spin-polarized current that flows through a magnetic tunnel junction (MTJ) device. For example, when a switching current flows through the MTJ device, a magnetization direction of a free layer of the MTJ device may change in relation to a magnetization direction of a pinned layer of the MTJ device (e.g., from a parallel state to an anti-parallel state). The device may have a higher resistance when the magnetization direction of the free layer is anti-parallel to the magnetization direction of the pinned layer as compared to a lower resistance when the magnetization direction the free layer is parallel to the magnetization direction of the pinned layer. The change in the magnetization direction of the free layer may correspond to a logic value of the memory cell changing from a logical "0" to a logical "1".

When reading (i.e., sensing) the logic value of the memory cell during a read operation, a sensing current flows through the MTJ device using the same path as the switching current. Because the sensing current and the switching current flow through the MTJ device using the same path, the sensing current should be sufficiently lower than the smallest switching current that causes the MTJ device to change stages (the "critical" switching current) as to not cause any disturbance of the logical value of the memory cell (i.e., read disturbance) during the read operation. For example, the sensing current should be small enough as to have little, or no, effect on the magnetization direction of the free layer.

However, a small sensing current may reduce a sensing margin between the memory cell and a reference cell. For example, a sensing circuit may sense an output voltage corresponding to the memory cell using a data branch and simultaneously sense an output voltage corresponding to the reference cell using a reference branch. The output voltage corresponding to the memory cell is compared to the output voltage corresponding to the reference cell to determine the logic value of the memory cell. Process variations of devices in the data branch and the reference branch may result in au offset voltage between the data branch and the reference branch that may reduce the sensing margin between the memory cell and the reference cell and may thus cause errors comparing the output voltage corresponding to the memory cell with the output voltage corresponding to the reference cell.

III. SUMMARY

Systems and methods of sensing a memory cell using multi-stage sensing are disclosed. A spin-transfer torque magnetoresistive random-access memory (STT-MRAM) includes memory cells and reference cells. Voltage offsets that may be introduced due to process variations of components in a sensing path may be cancelled when combining results of multiple sensing stages. For example, a sensing circuit may use a common sensing path to sense a state of a memory cell and to sense a state of a reference cell. The state of the memory cell may be sensed during a particular stage via the sensing path and the state of the reference cell may be sensed during another stage via the same sensing path. An output voltage corresponding to the state of the memory cell may be compared to an output voltage corresponding to the state of the reference cell to determine a logical value of the memory cell.

In a particular embodiment, a method includes sensing a state of a data cell to generate a data voltage. The state of the data cell corresponds to a state of a programmable resistance based memory element of the data cell. The method further includes sensing a state of a reference cell to generate a reference voltage. The state of the data cell and the state of the reference cell are sensed via a common sensing path. The method further includes determining a logic value of the data cell based on the data voltage and the reference voltage.

In another particular embodiment, an apparatus includes a sensing circuit and a sense amplifier. The sensing circuit is configured to sense a state of a data cell to generate a data voltage. The state of the data cell corresponds to a state of a programmable resistance based memory element of the data cell. The sensing circuit is further configured to sense a state of a reference cell to generate a reference voltage. The state of the data cell and the state of the reference cell are sensed via a common sensing path. The sense amplifier is configured to compare the data voltage with the reference voltage and generate a comparison output based on the comparison.

One particular advantage provided by at least one of the disclosed embodiments is an ability to reduce or eliminate an offset voltage caused by process variations in components in a sensing path by utilizing a common sensing path during multiple stages to sense a state of a memory cell and to sense a state of a reference cell. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 4:
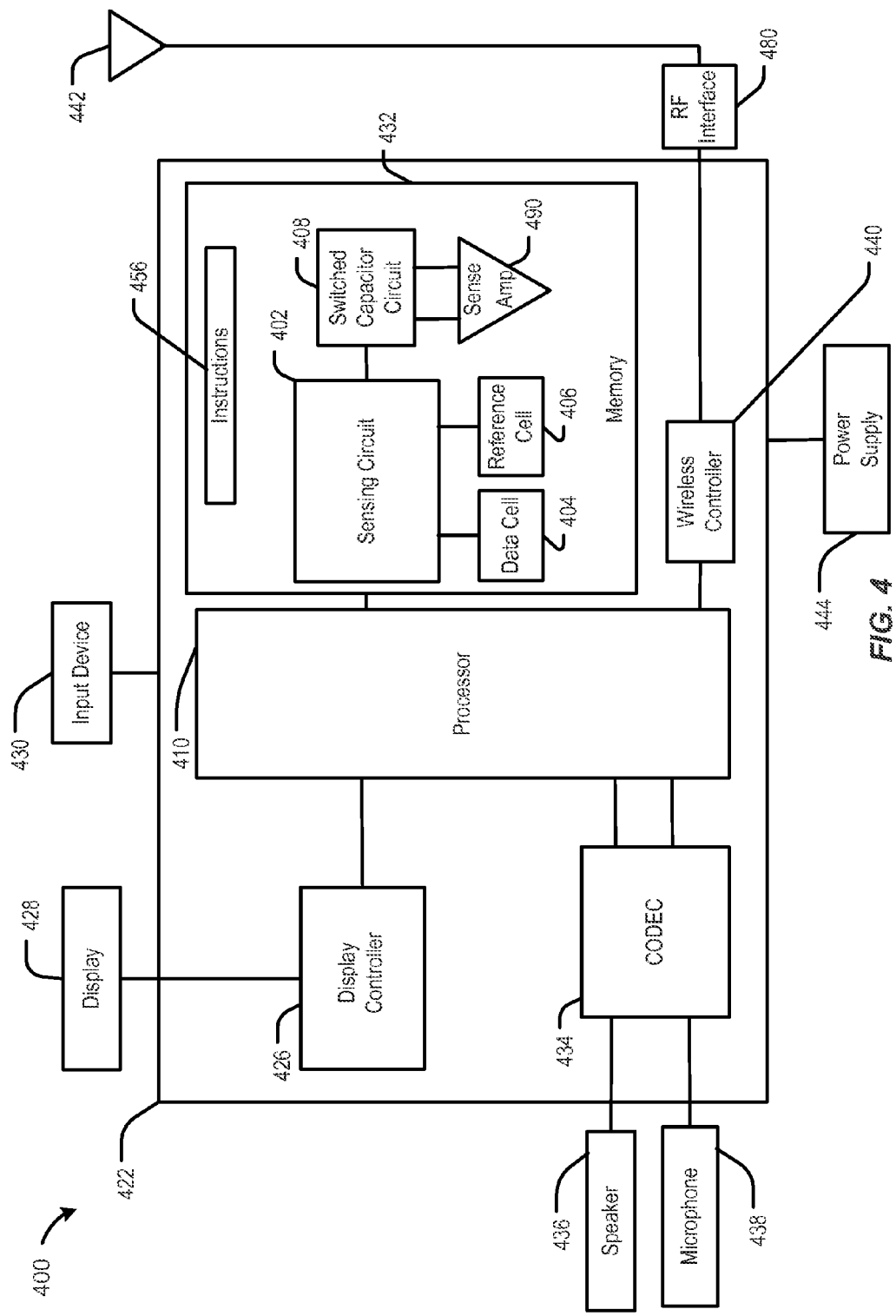
Figure 5:
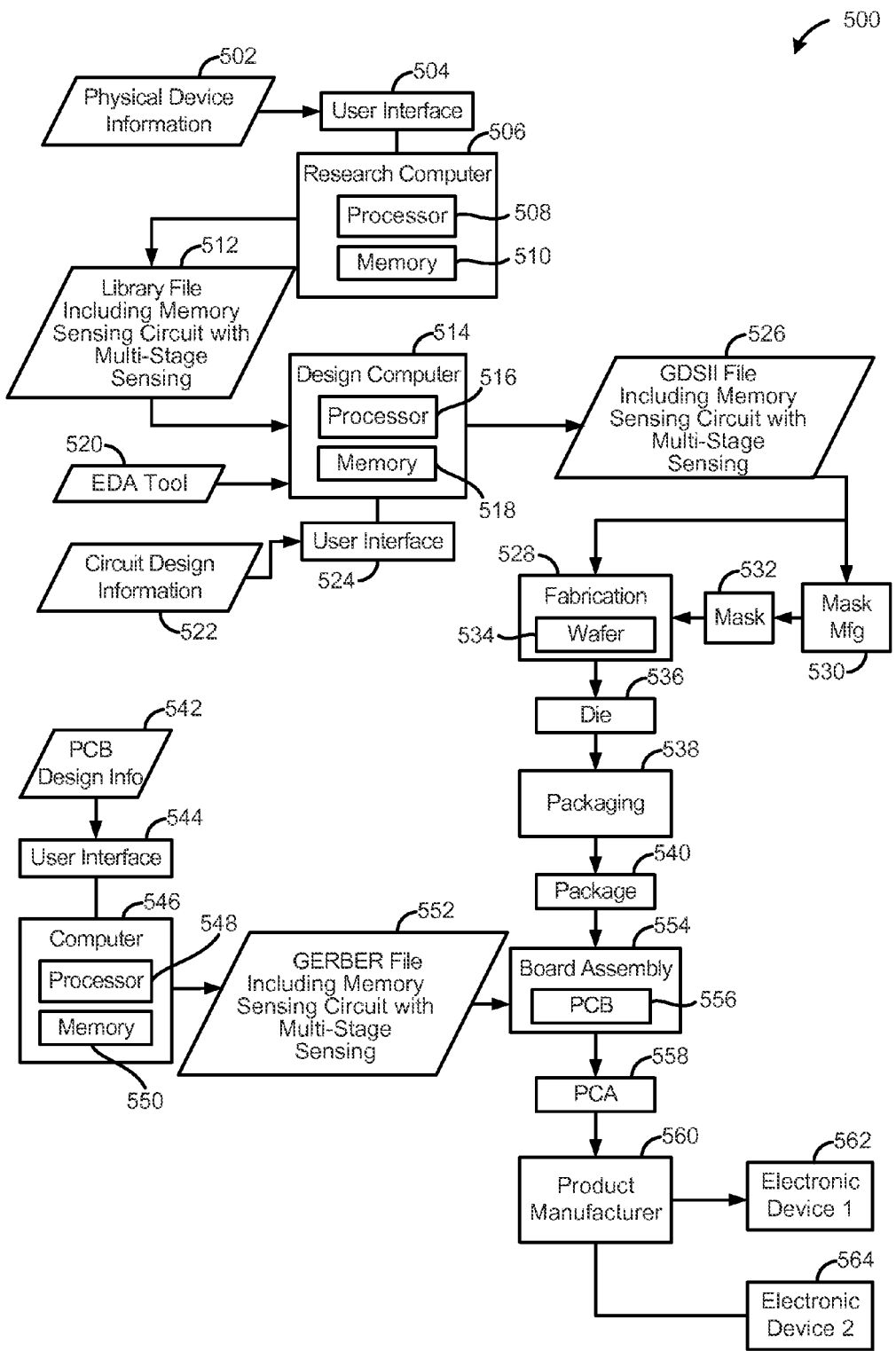

FIG. 4 is a block diagram of a wireless device including a component that is operable to read a value of a data cell using a multi-stage process to reduce a voltage offset; and FIG. 5 is a data flow diagram of a particular illustrative embodiment of a manufacturing process to manufacture electronic devices that include a component that is operable to read a value of a data cell using a multi-stage process to reduce a voltage offset.

V. DETAILED DESCRIPTION

Figure 1:
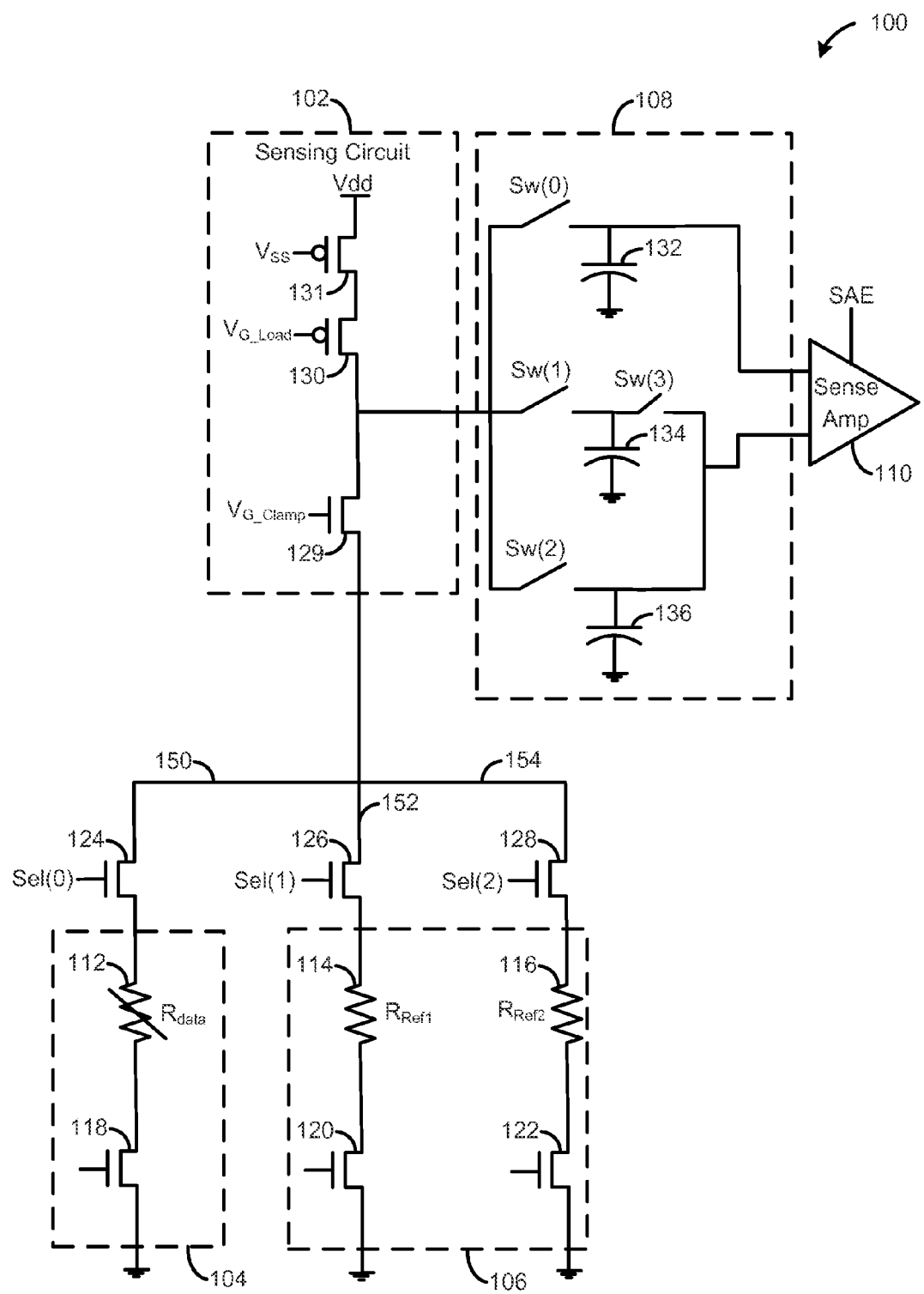
FIG. 1 is a circuit diagram of a particular illustrative embodiment of a memory system that is operable to read a value of a data cell using a three-stage process.

Referring to FIG. 1, a particular illustrative embodiment of a memory system 100 that is operable to read a value of a data cell using a three-stage process is shown. The memory system 100 includes a sensing circuit 102, a data cell 104, a reference cell 106, a switched capacitor circuit 108, and a sense amplifier 110. The data cell 104 may be a memory cell within a magnetoresistive random access-memory (MRAM), a phase change random access memory (PRAM), or a spin-transfer torque magnetoresistive random-access memory (STT-MRAM). The memory system 100 may reduce or cancel a voltage offset during sensing operations by using a common sensing path to sense a state of the data cell 104 and to sense a state of the reference cell 106. For example, the memory system 100 may use a three-stage process to sense the state of the data cell 104 and to sense the state of the reference cell 106 using the common sensing path.

The data cell 104 includes a programmable resistance based memory element 112 and a data cell access transistor 118. The programmable resistance based memory element 112 may be coupled to a drain of the data cell access transistor 118, and a source of the data cell access transistor 118 may be coupled to ground. In a particular embodiment, the programmable resistance based memory element 112 includes a magnetic tunnel junction (MTJ) device. A resistance ($R_{data}$) of the programmable resistance based memory element 112 may be based on a data value that is written to the programmable resistance based memory element 112 via a current provided to the programmable resistance based memory element 112.

For example, the programmable resistance based memory element 112 may have a pinned layer and a free layer. If the magnitude of the current applied to the programmable resistance based memory element 112 is less than a switching current ($I_C$), then the current may be used to sense the resistance ($R_{data}$) of the programmable resistance based memory element 112 (i.e., sense a state (e.g., a logic "1" or logic "0") of the data cell 104). For example, when the magnitude of the current is less than the switching current, the current may be used to sense whether the magnetization direction of the pinned layer and the free layer are parallel, corresponding to a low resistance state, or whether the magnetization direction of the pinned layer and the free layer are anti-parallel, corresponding to a high resistance state. If the magnitude of the current is equal to or greater than the switching current, then the current may be used to program the programmable resistance based memory element 112 (i.e., program the state of the data cell 104) based on a direction of the current.

The reference cell 106 includes a first resistance based memory element 114, a first access transistor 120, a second resistance based memory element 116, and a second access transistor 122. The first resistance based memory element 114 may be coupled to a drain of the first access transistor 120, and a source of the first access transistor 120 may be coupled to ground. The second resistance based memory element 116 may be coupled to a drain of the second access transistor 122, and a source of the second access transistor 122 may be coupled to ground. In a particular embodiment, the first resistance based memory element 114 and the second resistance based memory element 116 are MTJ devices. The first resistance based memory element 114 may have a "low" resistance ($R_{Ref1}$) and the second resistance based memory element 116 may have a "high" resistance ($R_{Ref2}$). For example, a resistance of the first resistance based memory element 114 may correspond to a state that is representative of a logical "0", and a resistance of the second resistance based memory element 116 may correspond to a state that is representative of a logical "1".

The sensing circuit 102 may include one or more components, such as a clamp transistor 129, a load transistor 130, and a source degeneration transistor 131, that may contribute to a voltage offset due to process variations. The source degeneration transistor 131 may be coupled to a system power supply (Vdd). In a particular embodiment, the clamp transistor 129 is an n-type metal oxide semiconductor (NMOS) transistor, and the load transistor 130 and the source degeneration transistor 131 are p-type metal oxide semiconductor (PMOS) transistors. A data cell selection transistor 124, a first selection transistor 126, and a second selection transistor 128 may also be included in the memory system 100.

The data cell selection transistor 124, the programmable resistance based memory element 112, and the data cell access transistor 118 may be included in a data branch 150 of the memory system 100. The first selection transistor 126, the first resistance based memory element 114, and the first access transistor 120 may be included in a first reference branch 152 of the memory system 100. The second selection transistor 128, the second resistance based memory element 116, and the second access transistor 122 may be included in a second reference branch 154 of the memory system 100. The data branch 150, the first reference branch 152, and the second reference branch 154 may be selectively coupled to the sensing circuit 102 via control signals Sel(0), Sel(1), Sel(2) received at the data cell selection transistor 124, the first selection transistor 126, and the second selection transistor 128, respectively. In a particular embodiment, the data cell selection transistor 124, the first selection transistor 126, and the second selection transistor 128 are included in a branch selection multiplexer (not shown).

The sensing circuit 102 is configured to sense a state of the data cell 104 to generate a data voltage. For example, the sensing circuit 102 may sense the current flowing through the programmable resistance based memory element 112 of the data cell 104 and generate the data voltage based on the current using the load transistor 130. The data voltage may be inversely proportional to the current flowing through the programmable resistance based memory element 112, which may be inversely proportional to the resistance ($R_{data}$) of the programmable resistance based memory element 112. The sensing circuit 102 may sense the state of the data cell 104 during a first sensing stage (i.e., during a first time period). The first sensing stage may correspond to when a control signal Sel(0) activates the data cell selection transistor 124 to couple the programmable resistance based memory element 112 to the sensing circuit 102. In a particular embodiment, the first sensing stage has a duration of approximately two nanoseconds.

The sensing circuit 102 is further configured to sense a state of the reference cell 106 to generate a reference voltage. For example, the sensing circuit 102 may sense a first state of the reference cell 106 during a second sensing stage (i.e., during a second time period) to generate a first reference voltage. The second sensing stage may correspond to when a control signal Sel(1) activates the first selection transistor 126 to couple the first resistance based memory element 114 to the sensing circuit 102. The sensing circuit 102 may sense the current flowing through the first resistance based memory element 114 of the reference cell 106 and generate the first reference voltage based on the current using the load transistor 130. The first reference voltage may be inversely proportional to the current flowing through the first resistance based memory element 114, which may be inversely proportional to the resistance ($R_{Ref1}$) of the first resistance based memory element 114. In a similar manner, the sensing circuit 102 is further configured to sense a second state of the reference cell 106 during a third sensing stage to generate a second reference voltage when a control signal Sel(2) activates the second selection transistor 128 to couple the second resistance based memory element 116 to the sensing circuit 102. The second reference voltage may be inversely proportional to the current flowing through the second resistance based memory element 116, which may be inversely proportional to the resistance ($R_{Ref2}$) of the second resistance based memory element 116. In a particular embodiment, the duration of the second and third sensing stages are each approximately two nanoseconds.

The switched capacitor circuit 108 includes a data capacitor 132, a first capacitor 134, and a second capacitor 136. A positive terminal of the data capacitor 132 may be coupled to a first input of the sense amplifier 110 and selectively coupled to the sensing circuit 102 via, a data cell switch Sw(0). A negative terminal of the data capacitor 132 may be coupled to ground. A positive terminal of the first capacitor 134 is selectively coupled to a second input of the sense amplifier 110 via a third switch Sw(3) and selectively coupled to the sensing circuit 102 via a first switch Sw(1). A negative terminal of the first capacitor 134 may be coupled to ground. A positive terminal of the second capacitor 136 may be coupled to the second input of the sense amplifier 110 and selectively coupled to the sensing circuit 102 via a second switch Sw(2). A negative terminal of the second capacitor 136 may be coupled to ground.

The data capacitor 132 is configured to store the data voltage generated at the sensing circuit 102 when the state (i.e., the resistance ($R_{data}$) of the programmable resistance based memory element 112) of the data cell 104 is sensed. For example, during the first sensing stage, the data cell switch Sw(0) may activate and the first and second switches Sw(1), Sw(2) may deactivate. In response to activating the data cell switch Sw(0), the sensing circuit 102 may charge the data capacitor 132 based on the data voltage. The first capacitor 134 is configured to store the first reference voltage generated at the sensing circuit 102 when the first state (i.e., the resistance ($R_{Ref1}$) of the first resistance based memory element 114) of the reference cell 106 is sensed. For example, during the second sensing stage, the first switch Sw(1) may activate and the data cell switch Sw(0) and the second switch Sw(2) may deactivate. In response to activating the first switch Sw(1), the sensing circuit 102 may charge the first capacitor 134 based on the first reference voltage. The second capacitor 136 is configured to store the second reference voltage generated at the sensing circuit 102 when the second state (i.e., the resistance ($R_{Ref2}$) of the second resistance based memory element 116) of the reference cell 106 is sensed. For example, during the third sensing stage, the second switch Sw(2) may activate and the data cell switch Sw(0) and the first switch Sw(1) may deactivate. In response to activating the second switch Sw(2), the sensing circuit 102 may charge the second capacitor 136 based on the second reference voltage.

An average of the first reference voltage and the second reference voltage may be determined to generate the reference voltage. For example, after the first and second capacitors 134, 136 are charged based on the first and second reference voltages, respectively, the third switch Sw(3) activates. The average of the first and second reference voltages (i.e., the reference voltage) may be generated by charge sharing when the third switch Sw(3) is activated. The reference voltage is provided to the second input of the sense amplifier 110 while the data voltage is provided to the first input of the sense amplifier 110.

The sense amplifier 110 is configured to determine a logic value of the data cell 104 based on the data voltage and the reference voltage. For example, in response to a sense amplifier enable signal (SAE), the sense amplifier 110 may compare the data voltage with the reference voltage. The logic value of the data cell 104 may correspond to a first value (i.e., a logical "0" value) when the data voltage is less than the reference voltage. The logic value of the data cell 104 may correspond to a second value (i.e., a logical "1" value) when the data voltage is greater than the reference voltage.

During operation, the memory system 100 uses the same load transistor 130 and clamp transistor 129 (i.e., a common sensing path) to sense the state of the data cell 104 and the state of the reference cell 106. For example, during the first sensing stage, the branch selection multiplexer activates the data cell selection transistor 124 and the sensing circuit 102 senses the state of the data cell 104 and generates the data voltage based on the state. The data branch 150 (and the load transistor 130 and the clamp transistor 129 (i.e., the sensing path)) is used to sense the state of the data cell 104. During the second sensing stage, the branch selection multiplexer activates the first selection transistor 126 and the sensing circuit 102 senses the first state of the reference cell 106 and generates the first reference voltage based on the first state. The first reference branch 152, and the sensing path, is used to sense the first state the reference cell. During the third sensing stage, the branch selection multiplexer activates the second selection transistor 128 and the sensing circuit 102 senses the second state of the reference cell 106 and generates the second reference voltage based on the second state. The second reference branch 154, and the sensing path, is used to sense the second state of the reference cell 106.

The data cell switch Sw(0) is activated during the first sensing stage to charge the data capacitor 132 based on the data voltage, the first switch Sw(1) is activated during the second sensing stage to charge the first capacitor 134 based on the first reference voltage, and the second switch Sw(2) is activated during the third sensing stage to charge the second capacitor 136 based on the second reference voltage. After the third sensing stage, the third switch Sw(3) is activated to induce charge sharing between the charges of the first and second capacitors 134, 136. The reference voltage is generated based on the shared charges. The logic value of the data cell 104 is determined by the sense amplifier 110 based on the data voltage (i.e., the charge of the data capacitor) and the reference voltage (i.e., the shared charges of the first and second capacitors 134, 136).

It will be appreciated that the memory system 100 of FIG. 1 may remove a mismatch from the data branch 150 and the reference branches 152, 154 by utilizing the same load transistor 130 and clamp transistor 129 (i.e., a common sensing path) when sensing the state of the data cell 104 and the state of the reference cell 106. For example, utilizing a separate load transistor and clamp transistor for the data branch 150 and each reference branch 152, 154 may limit a sensing margin of the sensing circuit 102 due to process variations in the separate load transistors and clamp transistors. By utilizing a common load transistor 130 and clamp transistor 129 in three different stages, the data voltage and the reference voltage may be generated and voltage offsets that would otherwise occur from using separate load and clamp transistors may be reduced or canceled. Cancelling the voltage offset may increase the sensing margin of the sensing circuit 102 which may reduce an amount of sensing current provided to the data cell 104 and the reference cell 106. To illustrate, as a result of increasing the sensing margin, the sensing current may be reduced from approximately 200 microamperes to approximately 20 microamperes. Utilizing a lower sensing current may reduce or eliminate read disturbance of the programmable resistance based memory element 112 during the sensing operation.

Figure 2:
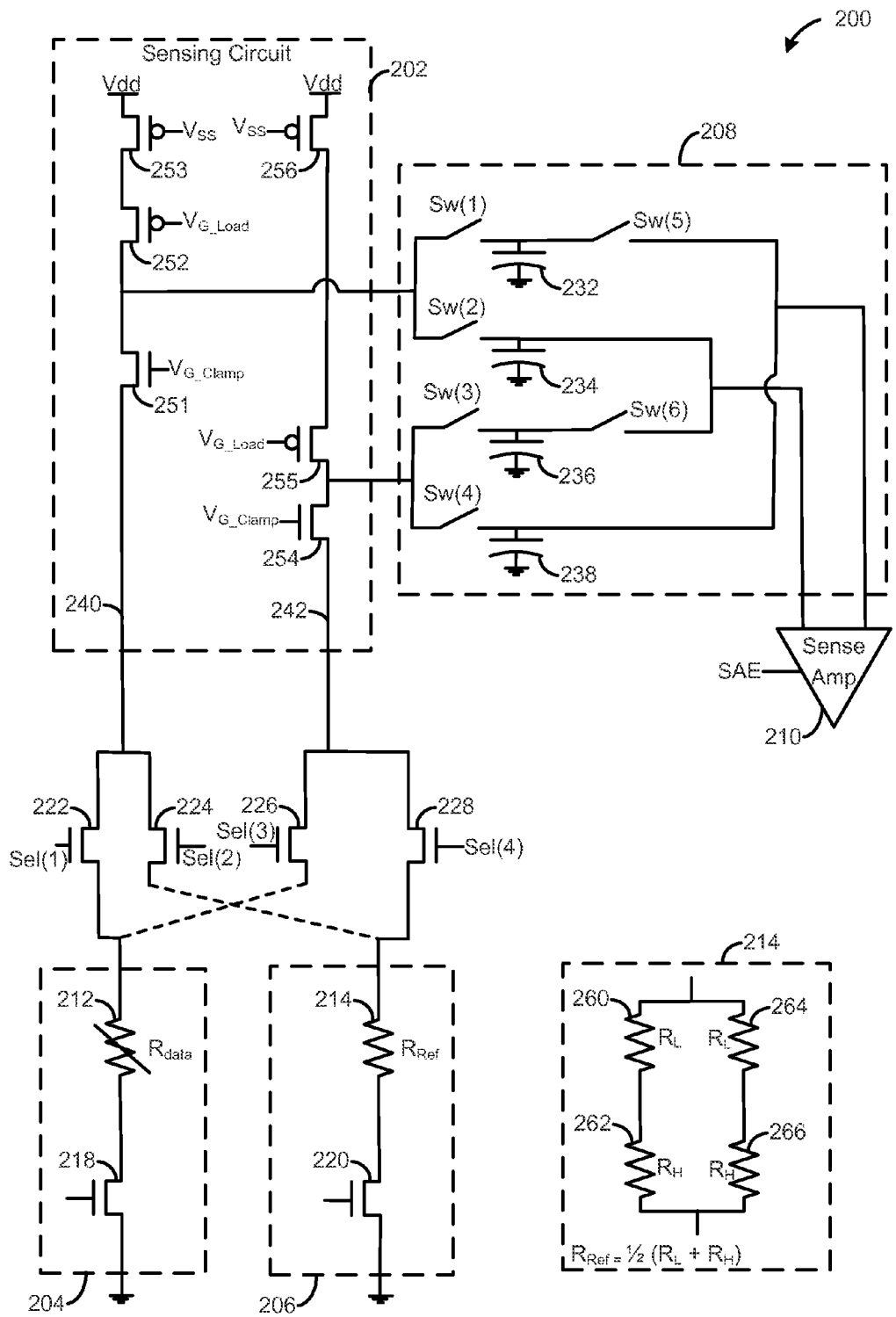
FIG. 2 is a circuit diagram of another particular illustrative embodiment of a memory system that is operable to read a value of a data cell using a two-stage process.

Referring to FIG. 2, another particular illustrative embodiment of a memory system 200 that is operable to read a value of a data cell using a two-stage process is shown. The memory system 200 includes a sensing circuit 202, a data cell 204, a reference cell 206, a switched capacitor circuit 208, and a sense amplifier 210. The data cell 204 may be a memory cell within a magnetoresistive random access-memory (MRAM), a phase change random access memory (PRAM), or a spin-transfer magnetoresistive torque random-access memory (STT-MRAM). The memory system 200 may reduce or cancel a voltage offset during sensing operations by using common sensing paths to sense a state of the data cell 204 and to sense a state of the reference cell 206. For example, the memory system 200 may use a two-stage process to sense the state of the data cell 204 and to sense the state of the reference cell 206 using common sensing paths.

The data cell 204 includes a programmable resistance based memory element 212 and a data cell access transistor 218. The programmable resistance based memory element 212 may be coupled to a drain of the data cell access transistor 218, and a source of the data cell access transistor 218 may coupled to ground. The programmable resistance based memory element 212 may correspond to the programmable resistance based memory element 112 of FIG. 1 and may operate in a substantially similar manner.

The reference cell 206 includes a reference resistance based memory element 214 and a reference cell access transistor 220. The reference resistance based memory element 214 may be coupled to a drain of the reference cell access transistor, and a source of the reference cell access transistor 220 may be coupled to ground. The reference resistance based memory element 214 may include a first resistor 260 having a "low" resistance ($R_L$) in series with a second resistor 262 having a "high" resistance ($R_H$). The low resistance ($R_L$) may correspond to a logical "0" value and the high resistance may correspond to a logical "1" value. The reference resistance based memory element 214 may also include a third resistor 264 having the "low" resistance ($R_L$) in series with a fourth resistor 266 having the "high" resistance ($R_H$). The first and second resistors 260, 262 may be coupled in parallel with the third and fourth resistors 264, 266, such that the total resistance ($R_{Ref}$) of the reference resistance based memory element 214 is approximately equal to one-half of the sum of the low resistance ($R_L$) and the high resistance ($R_H$).

The sensing circuit 202 may include one or more components that may contribute to a voltage offset due to process variations, such as a first clamp transistor 251, a first load transistor 252, a first source degeneration transistor 253, a second clamp transistor 254, a second load transistor 255, and a second source degeneration transistor 256. The first and second source degeneration transistors 253, 256 may be coupled to a system power supply (Vdd). In a particular embodiment, the clamp transistors 251, 254 are NMOS transistors, and the load and source degeneration transistors 252, 253, 255, 256 are PMOS transistors. A first sensing path 240 may include the first clamp transistor 251, the first load transistor 252, and the first source degeneration transistor 253. A second sensing path 242 may include the second clamp transistor 254, the second load transistor 255, and the second source degeneration transistor 256

Selection transistors 222-228 are configurable to couple the first sensing path 240 to the programmable resistance based memory element 212 and to couple the second sensing path 242 to the reference resistance based memory element 214 during a first sensing stage. For example, selection signals Sel(1)-Sel(4) may selectively activate and deactivate the selection transistors 222-228 to couple the first and second sensing paths 240, 242 to the programmable and reference resistance based memory elements 212, 214, respectively. In a similar manner, the selection transistors 222-228 are further configurable to couple the first sensing path 240 to the reference resistance based memory element 214 and to couple the second sensing path 242 to the programmable resistance based memory element 212 during a second sensing stage. In a particular embodiment, the selection transistors 222-228 are included in a sensing path selection multiplexer (not shown).

The sensing circuit 202 is configured to sense the state of the data cell 204 to generate a data voltage. The sensing circuit 202 may sense a first state of the data cell 204 during the first sensing stage using the first sensing path 240. For example, the sensing circuit 202, may sense the current flowing through the programmable resistance based memory element 212 of the data cell 204 and generate a first data voltage based on the current using the first load transistor 252. The sensing circuit 202 may also sense a second state of the data cell 204 during the second sensing stage using the second sensing path 242. For example, the sensing circuit 202 may sense the current flowing through the programmable resistance based memory element 212 of the data cell 204 and generate a second data voltage based on the current using the second load transistor 255. As explained below, the data voltage may be based on an average of the first data voltage and the second data voltage.

The sensing circuit 202 is further configured to sense the state of the reference cell 206 to generate a reference voltage. The sensing circuit 202 may sense a first state of the reference cell 206 during the first sensing stage using the second sensing path 242. For example, the sensing circuit 202 may sense the current flowing through the reference resistance based memory element 214 of the reference cell 206 and generate a first reference voltage based on the current using the second load transistor 255. The sensing circuit 202 may also sense a second state of the reference cell 206 during the second sensing stage using the first sensing path 240. For example, the sensing circuit 202 may sense the current flowing through the reference resistance based memory element 214 of the reference cell 206 and generate a second reference voltage based on the current using the first load transistor 252. As explained below, the reference voltage may be based on an average of the first reference voltage and the second reference voltage.

The switched capacitor circuit 208 includes a first capacitor 232, a second capacitor 234, a third capacitor 236, and a fourth capacitor 238. A positive terminal of the first capacitor 232 may be selectively coupled to the sensing circuit 202 via a first switch Sw(1) and selectively coupled to a first input of the sense amplifier 210 via a fifth switch Sw(5). A negative terminal of the first capacitor 232 may be coupled to ground. A positive terminal of the second capacitor 234 may be selectively coupled to the sensing circuit 202 via a second switch Sw(2) and coupled to a second input of the sense amplifier 210. A negative terminal of the second capacitor 234 may be coupled to ground. The first and second switches Sw(1), Sw(2) may be coupled to the first sensing path 240 of the sensing circuit 202. A positive terminal of the third capacitor 236 may be selectively coupled to the sensing circuit 202 via a third switch Sw(3) and selectively coupled to the second input of the sense amplifier 210 via a sixth switch Sw(6). A negative terminal of the third capacitor 236 may be coupled to ground. A positive terminal of the fourth capacitor 238 may be selectively coupled to the sensing circuit 202 via a fourth switch Sw(4) and coupled to the first input of the sense amplifier 210. A negative terminal of the fourth capacitor 238 may be coupled to ground. The third and fourth switches Sw(3), Sw(4) may be coupled to the second sensing path 242 of the sensing circuit 202.

The first capacitor 232 is configured to store the first data voltage generated at the sensing circuit 202 when the first state (i.e., the resistance ($R_{data}$) of the programmable resistance based memory element 212) of the data cell 204 is sensed using the first sensing path 240. For example, during the first sensing stage, the first switch Sw(1) may activate and the second switch Sw(2) may deactivate. In response to activating the first switch Sw(1), the sensing circuit 202, may charge the first capacitor 232 based on the first data voltage. The second capacitor 234 is configured to store the second reference voltage generated at the sensing circuit 202 when the second state (i.e., the resistance ($R_{Ref}$) of the reference resistance based memory element 214) of the reference cell 206 is sensed using the first sensing path 240. For example, during the second sensing stage, the second switch Sw(2) may activate and the first switch Sw(1) may deactivate. In response to activating the second switch Sw(2), the sensing circuit 202 may charge the second capacitor 234 based on the second reference voltage.

The third capacitor 236 is configured to store the first reference voltage generated at the sensing circuit 202 when the first state (i.e., the resistance ($R_{Ref}$) of the reference resistance based memory element 214) of the reference cell 206 is sensed using the second sensing path 242. For example, during the first sensing stage, the third switch Sw(3) may activate and the fourth switch Sw(4) may deactivate. In response to activating the third switch Sw(3), the sensing circuit 202 may charge the third capacitor 236 based on the first reference voltage. The fourth capacitor 238 is configured to store the second data voltage generated at the sensing circuit 202 when the second state (i.e., the resistance ($R_{data}$) of the programmable resistance based memory element 212) of the data cell 204 is sensed using the second sensing path 242. For example, during the second sensing stage, the fourth switch Sw(4) may activate and the third switch Sw(3) may deactivate. In response to activating the fourth switch Sw(4), the sensing circuit 202 may charge the fourth capacitor 238 based on the second data voltage.

An average of the first and second data voltages may be determined to generate the data voltage. For example, after the first and fourth capacitors 232, 238 are charged based on the first and second data voltages, respectively, the fifth switch Sw(5) activates. The average of the first and second data voltages (i.e., the data voltage) may be generated by charge sharing when the fifth switch Sw(5) is activated. The data voltage is provided to the first input of the sense amplifier 210. In a similar manner, an average of the first and second reference voltages may be determined to generate the reference voltage. For example, after the second and third capacitors 234, 236 are charged based on the second and first reference voltages, respectively, the sixth switch Sw(6) activates. The average of the first and second reference voltages (i.e., the reference voltage) may be generated by charge sharing when the sixth switch Sw(6) is activated. The reference voltage is provided to the second input of the sense amplifier 210.

The sense amplifier 210 is configured to determine a logic value of the data cell 204 based on the data voltage and the reference voltage. For example, in response to a sense amplifier enable signal (SAE), the sense amplifier 210 may compare the data voltage with the reference voltage. The logic value of the data cell 204 may correspond to a first value (i.e., a logical "0" value) when the data voltage is less than the reference voltage. The logic value of the data cell 204 may correspond to a second value (i.e., a logical "1" value) when data voltage is greater than the reference voltage.

During operation, the memory system 200 uses common sensing paths (i.e., the first sensing path 240 and the second sensing path 242) to sense the state of the data cell 204 and the state of the reference cell 206. For example, during the first sensing stage, the sensing path selection multiplexer activates the first selection transistor 222 and the fourth selection transistor 228, and the sensing circuit 202 senses the first state of the data cell 204 and the first state of the reference cell 204, respectively. The first sensing path 240 is used to sense the first state of the data cell 204, and the second sensing path 242 is used to sense the first state of the reference cell 206. During the second sensing stage, the sensing path selection multiplexer activates the second selection transistor 224 and the third selection transistor 226, and the sensing circuit 202 senses the second state of the reference cell 206 and the second state of the data cell 204, respectively. The first sensing path 240 is used to sense the second state of the reference cell 206, and the second sensing path 242 is used to sense the second state of the data cell 204.

The first and third capacitors 232, 236 are charged based on the first data voltage and the first reference voltage, respectively, during the first sensing stage. The second and fourth capacitors 234, 238 are charged based on the second reference voltage and the second data voltage, respectively, during the second sensing stage. After the second sensing stage, the fifth and sixth switches Sw(5), Sw(6) are activated to induce charge sharing between the charges of the first and fourth capacitors 232, 238 and charge sharing between the charges of the second and third capacitors 234, 236, respectively. The data voltage and the reference voltage are generated based on the shared charges. The logic value of the data cell 204 is determined by the sense amplifier 210 based on the data voltage and the reference voltage.

It will be appreciated that the memory system 200 of FIG. 2 may remove or reduce a voltage offset due to process variations in components of the first and second sensing paths 240, 242. For example, utilizing the first sensing path 240 to determine the data voltage and the reference voltage may eliminate or reduce a voltage offset that may otherwise be present when using the first sensing path 240 to determine solely the data voltage. During application, any voltage offset due to process variations in components of the first and second sensing paths 240, 242 during the first sensing stage may be reduced or canceled during the second sensing stage, which may reduce errors in determining the logic value of the data cell 204. Cancelling the voltage offset may increase the sensing margin of the sensing circuit 202 and may permit utilizing a lower sensing current. To illustrate, as a result of increasing the sensing margin, the sensing current may be reduced from approximately 200 microamperes to approximately 20 microamperes. Utilizing a lower sensing current may reduce or eliminate read disturbance of the programmable resistance based memory element 212 during the sensing operation.

Figure 3:
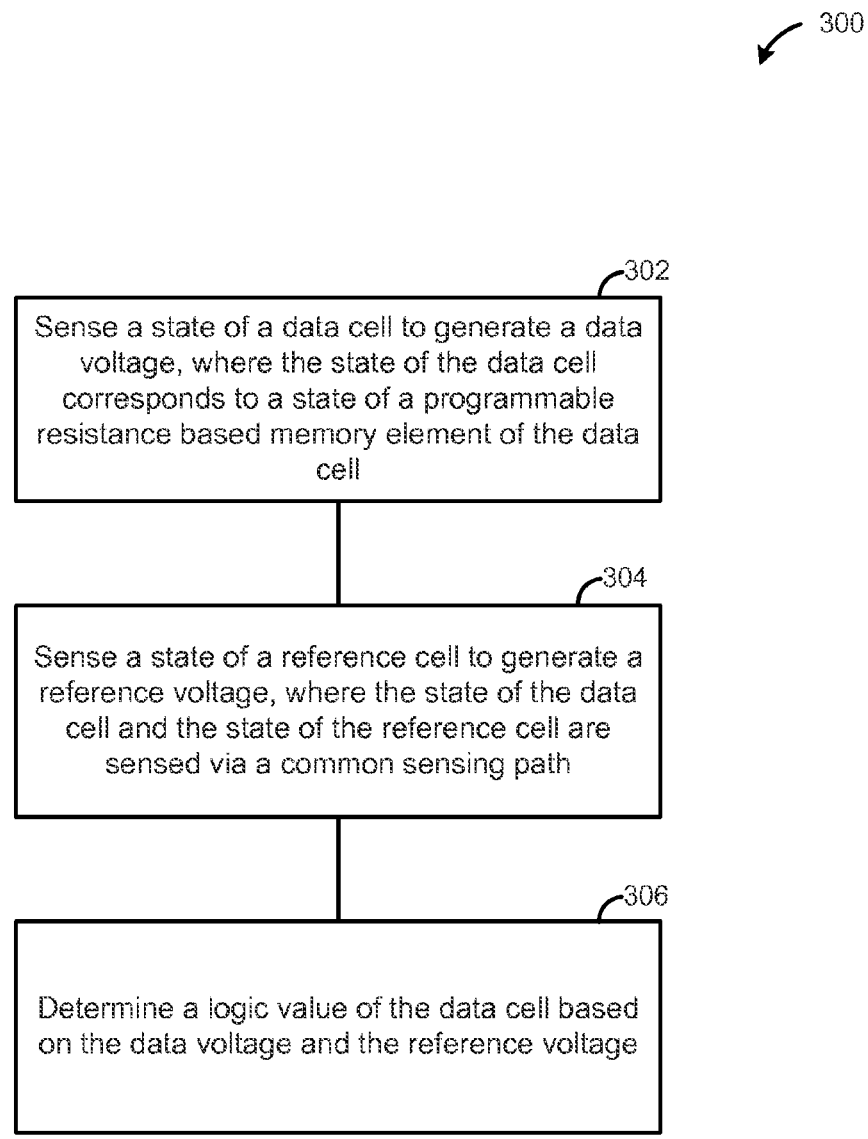
FIG. 3 is a flowchart of a particular embodiment of a method of reading a value of a data cell using a multiple-stage process.

Referring to FIG. 3, a flowchart of a particular embodiment of a method 300 of reading a value of a data cell using a multiple-stage process is shown. In an illustrative embodiment, the method 300 may be performed using the memory system 100 of FIG. 1, the memory system 200 of FIG. 2, or any combination thereof.

The method 300 includes sensing a state of a data cell to generate a data voltage, at 302. For example, in FIG. 1, the sensing circuit 102 may sense the current flowing through the programmable resistance based memory element 112 of the data cell 104 and generate the data voltage based on the current using the load transistor 130. The current may be inversely proportional to the resistance ($R_{data}$) of the programmable resistance based memory element 112. The state of the data cell 104 may correspond to the resistance ($R_{data}$) a state) of the programmable resistance based memory element 112. As another example, in FIG. 2, the sensing circuit 202 may sense the first state of the data cell 204 during the first sensing stage using the first sensing path 240. For example, the sensing circuit 202 may sense the current flowing through the programmable resistance based memory element 212 of the data cell 204 and generate the first data voltage based on the current using the first load transistor 252. The sensing circuit 202 may also sense the second state of the data cell 204 during the second sensing stage using the second sensing path 242. For example, the sensing circuit 202 may sense the current flowing through the programmable resistance based memory element 212 of the data cell 204 and generate the second data voltage based on the current using the second load transistor 255. The state of the data cell 204 may correspond to the resistance ($R_{data}$) of the programmable resistance based memory element 212.

A state of the reference cell may be sensed to generate a reference voltage, at 304. For example, in FIG. 1, the sensing circuit 102 may sense the first state of the reference cell 106 during the second sensing stage to generate the first reference voltage. The sensing circuit 102 may sense the current flowing through the first resistance based memory element 114 of the reference cell 106 and generate the first reference voltage based on the current using the load transistor 130. The sensing circuit 102 may also sense the second state of the reference cell 106 during the third sensing stage to generate the second reference voltage. For example, the sensing circuit 102 may sense the current flowing through the second resistance based memory element 116 of the reference cell 106 and generate the second reference voltage based on the current using the load transistor 130. The state of the data cell 104 and the state of the reference cell 106 are sensed via a common sensing path. The reference voltage may be based on an average of the first reference voltage and the second reference voltage.

As another example, in FIG. 2, the sensing circuit 202 may sense the first state of the reference cell 206 during the first sensing stage using the second sensing path 242. For example, the sensing circuit 202 may sense the current flowing through the reference resistance based memory element 214 of the reference cell 206 and generate a first reference voltage based on the current using the second load transistor 255. The sensing circuit 202 may also sense the second state of the reference cell 206 during the second sensing stage using the first sensing path 240. For example, the sensing circuit 202 may sense the current flowing through the reference resistance based memory element 214 of the reference cell 206 and generate the second reference voltage based on the current using the first load transistor 252. The state of the data cell 104 and the state of the reference cell 106 are sensed via common sensing paths 240, 242. The reference voltage may be based on an average of the first reference voltage and the second reference voltage.

A logic value may be determined based on the data voltage and the reference voltage, at 306. For example, in FIG. 1, the sense amplifier 110 may determine the logic value of the data cell 104 based on the data voltage and the reference voltage. For example, in response to the sense amplifier enable signal (SAE), the sense amplifier 110 may compare the data voltage with the reference voltage. The logic value of the data cell 104 may correspond to a first value (i.e., a logical "0" value) when the data voltage is less than the reference voltage. The logic value of the data cell 104 may correspond to a second value (i.e., a logical "1" value) when the data voltage is greater than the reference voltage. The sense amplifier 210 of FIG. 2 operates in a substantially similar manner as the sense amplifier 110 of FIG. 1.

It will be appreciated that the method 300 of FIG. 3 may at least partially cancel an effect on the data voltage due to process variations in one or more components of a sensing path by an effect on the reference voltage due to process variations when determining the logic value. For example, in FIG. 1, by utilizing a common load transistor 130 and clamp transistor 129 in three different stages, the data voltage and the reference voltage may be generated and voltage offsets that would otherwise occur from using separate load and clamp transistors may be reduced or canceled. As another example, in FIG. 2, any voltage offset due to process variations in components of the first and second sensing paths 240, 242 during the first sensing stage may be reduced or canceled during the second sensing stage, which may reduce errors in determining the logic value of the data cell 204.

Referring to FIG. 4, a block diagram of a wireless device 400 including a component that is operable to read a value of a data cell using a multi-stage process to reduce a voltage offset is shown. The device 400 includes a processor 410, such as a digital signal processor (DSP), coupled to a memory 432.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434. FIG. 4 also indicates that a wireless controller 440 can be coupled to the processor 410 and to an antenna 442 via a radio-frequency (RF) interface 490 disposed between the wireless controller 440 and the antenna 442.

The memory 432 may include a sensing circuit 402, a data cell 404, a reference cell 406, a switched capacitor circuit 408, and a sense amplifier (SA) 490. The sensing circuit 402 may correspond to the sensing circuit 102 of FIG. 1 or the sensing circuit 202 of FIG. 2. The data cell 404 may be coupled to the sensing circuit 402. The data cell 404 may correspond to the data cell 104 of FIG. 1 or the data cell 204 of FIG. 2. The reference cell 406 may also be coupled to the sensing circuit 402. The reference cell 406 may correspond to the reference cell 106 of FIG. 1 or the reference cell 206 of FIG. 2. The switched capacitor circuit 408 may also be coupled to the sensing circuit 402. The switched capacitor circuit 408 may correspond to the switched capacitor circuit 108 of FIG. 1 or the switched capacitor circuit 208 of FIG. 2. The sense amplifier (SA) 490 may be coupled to the switched capacitor circuit 408. The sense amplifier (SA) 490 may correspond to the sense amplifier 110 of FIG. 1 or the sense amplifier 210 of FIG. 2.

The memory 432 may be a storage device that includes executable instructions 456. In a particular embodiment, the instructions 456 may be stored in a tangible non-transitory processor-readable storage medium and may be executed by a processor, such as the processor 410, to enable coupling of a sensing circuit to a data cell. For example, the processor 410 may selectively bias a gate of data selection transistor 124 of FIG. 1 coupled to the sensing circuit 102 and to the programmable resistance based memory element 112 during the first sensing stage. The state of the data cell 104 may be sensed to generate the data voltage based on the conduction between the sensing circuit 102 and the data cell 104. As another example, the processor 410 may selectively bias a gate of the first selection transistor 222 of FIG. 2 coupled to the first sensing path 240 and to the data cell 204 to generate the first data voltage during the first sensing stage. The processor 410 may also selectively bias agate of the third selection transistor 226 coupled to the second sensing path 242 and to the data cell 204 to generate the second data voltage during the second sensing stage.

The instructions 456 may also be executable by processor 410 to enable coupling of the sensing circuit to a reference cell. For example, the processor 410 may selectively bias a gate of the first selection transistor 126 of FIG. 1 coupled to the sensing circuit 102 and to the first resistance based memory element 114 of the reference cell 106 the second sensing stage to generate the first reference voltage. The processor 410 may also selectively bias a gate of the second selection transistor 128 coupled to the sensing circuit 102 and to the second resistance based memory element 116 of the reference cell 106 during the third sensing stage to generate the second reference voltage. As another example, the processor 410 may selectively bias a gate of the fourth selection transistor 228 of FIG. 2 coupled to the second sensing path 242 and to the reference cell 206 to generate the first reference voltage during the first sensing stage. The processor 410 may also selectively bias a gate of the second selection transistor 224 coupled to the first sensing path 240 and to the reference cell 206 to generate the second reference voltage during the second sensing stage.

The instructions 456 may also be executable by the processor 410 to determine a logic value of the data cell based on the data voltage and the reference voltage. For example, in FIG. 1, the processor 410 may bias the sense amplifier enable signal (SAE) to activate the sense amplifier 110. Upon activation, the sense amplifier 110 may determine the logic value of the data cell 104 based on the data voltage and the reference voltage. For example, in response to the sense amplifier enable signal (SAE), the sense amplifier 110 may compare the data voltage with the reference voltage. In another particular embodiment, the processor 410 may determine the logic value of the data cell 104 based on the data voltage and the reference voltage independent of the sense amplifier 110. The processor 410 may function in a substantially similar manner when determining the logic value of the data cell 204 of FIG. 2.

The instructions 456 may also be executable by an alternative processor (not shown) coupled to the processor 410. As a non-limiting example, the instructions 456 may be executable by a processor, such as in a memory controller of the memory 432, that is coupled to the branch selection multiplexer of FIG. 1 or the path selection multiplexer of FIG. 2.

In a particular embodiment, the processor 410, the display controller 426, the memory 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller.

In conjunction with the described embodiments, an apparatus includes means for sensing a state of a data cell to generate a data voltage. For example, the means for sensing the state of the data cell may include the sensing circuit 102 of FIG. 1, the data cell selection transistor 124 of FIG. 1, the data cell 104 of FIG. 1, the sensing circuit 202 of FIG. 2, the first selection transistor 222 of FIG. 2, the third selection transistor 226 of FIG. 2, the data cell 204 of FIG. 2, the processor 410 programmed to execute the instructions 456 of FIG. 4, or one or more other devices, circuits, modules, or instructions to sense state of the data cell.

The apparatus may also include means for sensing a state of a reference cell to generate a reference voltage. For example, the means for sensing the state of the reference cell may include the sensing circuit 102 of FIG. 1, the first selection transistor 126 of FIG. 1, the reference cell 106 of FIG. 1, the sensing circuit 202 of FIG. 2, the second selection transistor 224 of FIG. 2, the fourth selection transistor 228 of FIG. 4, the reference cell 406 of FIG. 4, the processor 410 programmed to execute the instructions 456 of FIG. 4, or one or more other devices, circuits, modules, or instructions to sense the state of the reference cell.

The apparatus may also include means for determining a logic value of the data cell based on the data voltage and the reference voltage. For example, the means for determining the logic value of the data cell may include the sensing circuit 102 of FIG. 1, switched capacitor circuit 108 of FIG. 1, the sense amplifier 110 of FIG. 1, the sensing circuit 202 of FIG. 2, the switched capacitor circuit 208 of FIG. 2, the sense amplifier 210 of FIG. 2, the processor 410 programmed to execute the instructions 456 of FIG. 4, or one or more other devices, circuits, modules, or instructions to determine the logic value of the data cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as a device that includes components of the memory system 100 of FIG. 1, components of the memory system 200 of FIG. 2, or any combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including components of the memory system 100 of FIG. 1, components of the memory system 200 of FIG. 2, or any combination thereof, that is provided for use with an electronic design automation (EDA) tool 520.

The library file 512 may be used in conjunction with the FDA tool 520 at a design computer 514 including a processor 516, such as one or more processing cores, coupled to a memory 518. The EDA tool 520 may be stored as processor executable instructions at the memory 518 to enable a user of the design computer 514 to design a device that includes components of the memory system 100 of FIG. 1, components of the memory system 200 of FIG. 2, or any combination thereof, or any combination thereof, of the library file 512. For example, a user of the design computer 514 may enter circuit design information 522 via a user interface 524 coupled to the design computer 514.

The circuit design information 522 may include design information representing at least one physical property of a semiconductor device that includes components of the memory system 100 of FIG. 1, components of the memory system 200 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing a device that includes components of the memory system 100 of FIG. 1, components of the memory system 200 of FIG. 2, or any combination thereof, and that also includes additional electronic circuits and components within the SOC.

The GDSII file 526 may be received at a fabrication process 528 to manufacture a semiconductor device that includes components of the memory system 100 of FIG. 1, components of the memory system 200 of FIG. 2, or any combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including components of the memory system 100 of FIG. 1, components of the memory system 200 of FIG. 2, or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the a device that includes components of the memory system 100 of FIG. 1, components of the memory system 200 of FIG. 2, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including components of the memory system 100 of FIG. 1, components of the memory system 200 of FIG. 2, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer, into which components of the memory system 100 of FIG. 1, components of the memory system 200 of FIG. 2, or any combination thereof is integrated. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrates circuitry including memory and on-chip circuitry.

A device that includes components of the memory system 100 of FIG. 1, components of the memory system 200 of FIG. 2, or any combination thereof, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    sensing a state of a data cell using a first sensing path to generate a data voltage, wherein the state of the data cell corresponds to a state of a programmable resistance based memory element of the data cell;
    sensing a first state of a reference cell using the first sensing path to generate a first reference voltage;
    performing a charge sharing operation to generate a shared reference voltage based on the first reference voltage and a second reference voltage associated with the reference cell; and
    determining a logic value of the data cell based on the data voltage and the shared reference voltage.

2. The method of claim 1, wherein the state of the data cell and the state of the reference cell are sensed via a common sensing path, and wherein an effect on the data voltage due to process variation in one or more components in the common sensing path is at least partially canceled by an effect on the shared reference voltage due to the process variation in the one or more components.

3. The method of claim 1, further comprising:
    sensing a second state of the reference cell to generate the second reference voltage; and
    comparing the data voltage with the shared reference voltage.

4. The method of claim 3, wherein the logic value of the data cell corresponds to a first value when the data voltage is less than the shared reference voltage, and wherein the logic value of the data cell corresponds to a second value when the data voltage is greater than the shared reference voltage.

5. The method of claim 1, wherein the state of the data cell is sensed during a first sensing stage, wherein the first state of the reference cell is sensed during a second sensing stage, and further comprising sensing a second state of the reference cell during a third sensing stage to generate the second reference voltage.

6. The method of claim 5, wherein the first state of the reference cell corresponds to a state of a first resistance based memory element of the reference cell and wherein the second state of the reference cell corresponds to a state of a second resistance based memory element of the reference cell.

7. The method of claim 1, wherein performing the charge sharing operation enables charge sharing between a first capacitor and a second capacitor of a switched capacitor circuit to generate the shared reference voltage, and wherein the shared reference voltage is based on an average of the first reference voltage and the second reference voltage.

8. The method of claim 5, wherein the first sensing stage corresponds to a first time period, the second sensing stage corresponds to a second time period, and the third sensing stage corresponds to a third time period.

9. The method of claim 1, wherein the programmable resistance based memory element is a magnetic tunnel junction (MTJ) device.

10. The method of claim 1, wherein the state of the programmable resistance based memory element corresponds to a resistance of the programmable resistance based memory element.

11. The method of claim 2, wherein the first sensing path includes a clamp transistor, a load transistor, and a source degeneration transistor.

12. The method of claim 1, wherein sensing the state of the data cell, sensing the first state of the reference cell, and determining the logic value of the data cell are initiated by a processor integrated into an electronic device.

13. The method of claim 1, further comprising sensing a state of a second resistance based memory element of the reference cell to generate the second reference voltage.

14. The method of claim 1, wherein the state of the data cell is obtained during a first sensing stage and the first state of the reference cell is obtained during a second sensing stage, and further comprising:

sensing a second state of the reference cell during the first sensing stage using a second sensing path to generate the second reference voltage; and sensing a second state of the data cell during the second sensing stage using the second sensing path to generate a second data voltage, wherein the first sensing path and the second sensing path comprise common sensing paths, and wherein the logic value of the data cell is further based on the second data voltage of the data cell.

15. The method of claim 14, further comprising averaging the data voltage of the data cell and the second data voltage of the data cell to generate an average data voltage of the data cell, wherein the logic value of the data cell is further based on the average data voltage of the data cell.

16. The method of claim 15, wherein averaging the data voltage of the data cell and the second data voltage of the data cell to generate the average data voltage of the data cell includes sharing a charge between a third capacitor and a fourth capacitor.

17. An apparatus comprising:
a sensing circuit configured to:
sense a state of a data cell to generate a data voltage, wherein the state of the data cell corresponds to a state of a programmable resistance based memory element of the data cell; and
sense a first state of a reference cell to generate a first reference voltage;
a switched capacitor circuit configured to share a charge between a first capacitor and a second capacitor to generate a shared reference voltage based on the first reference voltage and a second reference voltage associated with the reference cell; and
a sense amplifier configured to:
compare the data voltage to the shared reference voltage; and
generate a comparison output based on the comparison.

18. The apparatus of claim 17, wherein the sensing circuit is configured to:
sense a first state of the data cell during a first sensing stage using a first sensing path to generate a first data voltage; and
sense a second state of the data cell during a second sensing stage using a second sensing path to generate a second data voltage, wherein the data voltage is generated based on an average of the first data voltage and the second data voltage, and wherein the first sensing path and the second sensing path comprise common sensing paths.

19. The apparatus of claim 18, wherein the switched capacitor circuit is further configured to share a charge between a third capacitor and a fourth capacitor to generate the data voltage of the data cell.

20. The apparatus of claim 18, wherein the first sensing path and the second sensing path each include a source degeneration transistor, a load transistor, and a clamp transistor.

21. The apparatus of claim 17, wherein the comparison output corresponds to a logic value of the data cell.

22. The apparatus of claim 17, wherein the state of the data cell and the first state of the reference cell are sensed via a common sensing path, and wherein an effect on the data voltage due to process variation in one or more components in the common sensing path is at least partially canceled by an effect on the shared reference voltage due to process variation in the one or more components.

23. The apparatus of claim 22, wherein the common sensing path includes a source degeneration transistor, a load transistor, and a clamp transistor.

24. The apparatus of claim 17, wherein the sensing circuit and the sense amplifier are integrated into at least one semiconductor die.

25. The apparatus of claim 17, further comprising a device selected from a set top box, a music player, a video player, an entertainment unit, a navigation device, a communications device, a personal digital assistant (PDA), a fixed location data unit, and a computer, into which the sensing circuit and the sense amplifier are integrated.

26. The apparatus of claim 17, wherein the sensing circuit includes a source degeneration transistor coupled to a power supply.

27. An apparatus comprising:
means for sensing a state of a data cell to generate a data voltage, wherein the state of the data cell corresponds to a state of a programmable resistance based memory element of the data cell;
means for sensing a first state of a reference cell to generate a first reference voltage;
means for sharing a charge between means for storing the first reference voltage and means for storing a second reference voltage to generate a shared reference voltage based on the first reference voltage and the second reference voltage associated with the reference cell; and
means for determining a logic value of the data cell based on the data voltage and the shared reference voltage.

28. The apparatus of claim 27, further comprising means for comparing the data voltage to the shared reference voltage.

29. The apparatus of claim 28, wherein the means for determining the logic value of the data cell is based on the means for comparing the data voltage to the shared reference voltage.

30. The apparatus of claim 27, further comprising a device selected from a set top box, a music player, a video player, an entertainment unit, a navigation device, a communications device, a personal digital assistant (PDA), a fixed location data unit, and a computer, into which the means for sensing the state of the data cell, the means for sensing the state of the reference cell, and the means for determining the logic value of the data cell are integrated.

31. A non-transitory computer readable medium comprising instructions that, when executed by a processor, cause the processor to:
enable coupling of a sensing circuit to a data cell, wherein a state of the data cell is sensed using a first sensing path to generate a data voltage based on the coupling of the sensing circuit to the data cell, and wherein the state of the data cell corresponds to a state of a programmable resistance based memory element of the data cell;
enable coupling of the sensing circuit to a reference cell, wherein a first state of the reference cell is sensed using the first sensing path to generate a first reference voltage based on the coupling of the sensing circuit to the reference cell;
enable performing a charge sharing operation to generate a shared reference voltage based on the first reference voltage and a second reference voltage associated with the reference cell; and
determine a logic value of the data cell based on the data voltage and the shared reference voltage.

32. The non-transitory computer readable medium of claim 31, wherein enabling the coupling of the sensing circuit to the data cell includes activating a first selection transistor coupled to the sensing circuit and to the programmable resistance based memory element during a first sensing stage.

33. The non-transitory computer readable medium of claim 32, wherein enabling the coupling of the sensing circuit to the reference cell includes:
   activating a second selection transistor coupled to the sensing circuit and to a first resistance based memory element of the reference cell during a second sensing stage to generate the first reference voltage; and
   activating a third selection transistor coupled to the sensing circuit and to a second resistance based memory element of the reference cell during a third sensing stage to generate the second reference voltage.

34. The non-transitory computer readable medium of claim 31, wherein enabling the coupling of the sensing circuit to the data cell includes:
   activating a first selection transistor coupled to the first sensing path and to the data cell to generate a first data voltage during a first sensing stage; and
   activating a second selection transistor coupled to a second sensing path and to the data cell to generate a second data voltage during a second sensing stage.

35. The non-transitory computer readable medium of claim 34, wherein enabling the coupling of the sensing circuit to the reference cell includes:
   activating a third selection transistor coupled to the second sensing path and to the reference cell to generate the first reference voltage during the first sensing stage; and
   activating a fourth selection transistor coupled to the first sensing path and to the reference cell to generate the second reference voltage during the second sensing stage.

36. The non-transitory computer readable medium of claim 35, wherein the data voltage corresponds to an average of the first data voltage and the second data voltage, and wherein the shared reference voltage corresponds to an average of the first reference voltage and the second reference voltage.

37. A method comprising:
   a step for sensing a state of a data cell to generate a data voltage using a first sensing path, wherein the state of the data cell corresponds to a state of a programmable resistance based memory element of the data cell;
   a step for sensing a first state of a reference cell to generate a first reference voltage using the first sensing path;
   a step for performance of a charge sharing operation to generate a shared reference voltage based on the first reference voltage and a second reference voltage associated with the reference cell; and
   a step for determining a logic value of the data cell based on the data voltage and the shared reference voltage.

38. The method of claim 37, wherein the step for determining the logic value of the data cell is performed at a processor integrated into an electronic device.

\* \* \* \* \*